United States Patent
Hiroshima

(10) Patent No.: US 7,714,308 B2
(45) Date of Patent: May 11, 2010

(54) VARIABLE SHAPED ELECTRON BEAM LITHOGRAPHY SYSTEM AND METHOD FOR MANUFACTURING SUBSTRATE

(75) Inventor: Masahito Hiroshima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 273 days.

(21) Appl. No.: 11/899,291

(22) Filed: Sep. 5, 2007

(65) Prior Publication Data

US 2008/0054196 A1 Mar. 6, 2008

(30) Foreign Application Priority Data

Sep. 6, 2006 (JP) ............................. 2006-241331

(51) Int. Cl.
H01J 37/30 (2006.01)
H01J 37/08 (2006.01)
G21K 5/00 (2006.01)

(52) U.S. Cl. ............................ 250/492.23; 250/492.22; 250/310

(58) Field of Classification Search ................. 250/310, 250/311, 396 R, 396 ML, 397, 398, 491.1, 250/492.1, 492.2, 492.3, 492.22, 492.23
See application file for complete search history.

(56) References Cited

U.S. PATENT DOCUMENTS

| | | | | |
|---|---|---|---|---|
| 4,577,111 A | * | 3/1986 | Saitou et al. ............. | 250/492.2 |
| 5,886,357 A | * | 3/1999 | Kojima ................... | 250/492.23 |
| 5,998,797 A | * | 12/1999 | Nakajima ................ | 250/492.2 |
| 6,014,200 A | * | 1/2000 | Sogard et al. ............ | 355/53 |
| 6,207,965 B1 | * | 3/2001 | Koike .................... | 250/492.23 |
| 6,262,429 B1 | * | 7/2001 | Rishton et al. .......... | 250/492.23 |
| 2002/0136971 A1 | * | 9/2002 | Ito et al. ................. | 430/22 |
| 2004/0168632 A1 | * | 9/2004 | Ito et al. ................. | 118/715 |
| 2007/0291244 A1 | * | 12/2007 | Chang et al. ............ | 355/67 |
| 2008/0054196 A1 | * | 3/2008 | Hiroshima ............... | 250/492.23 |

FOREIGN PATENT DOCUMENTS

| | | |
|---|---|---|
| JP | 61-255022 | 11/1986 |
| JP | 1-120022 | 5/1989 |
| JP | 8-97122 | 4/1996 |
| JP | 09-082630 | 3/1997 |

* cited by examiner

*Primary Examiner*—Bernard E Souw
(74) *Attorney, Agent, or Firm*—Scully, Scott, Murphy & Presser, P.C.

(57) ABSTRACT

This VSB lithography system includes a first, second and third aperture for forming a single electron beam in each of the rectangular opening portion that are provided, and draws a figure pattern using the single electron beam formed by passing the beam through the first, second and third aperture in sequence. Each of the first, second and third aperture has a mechanism for rotationally driving the aperture around an optical axis up to an arbitrary angle from 0 to 360°. Further, in the third aperture, a mechanism for varying the opening slit width of the rectangular opening portion is provided.

11 Claims, 18 Drawing Sheets

(a)

(b)

(c)

(b)

(a)

though a complex pattern using many oblique sides with an arbitrary angle has to be drawn. As the result, in a drawing process using the current VSB lithography system, the number of the divided drawing figures becomes enormous. Therefore, to improve productivity in this process, the largest, technical challenge is to reduce the number of the divided figures in order to shorten the drawing time.

VARIABLE SHAPED ELECTRON BEAM LITHOGRAPHY SYSTEM AND METHOD FOR MANUFACTURING SUBSTRATE

This application is based upon and claims the benefit of priority from Japanese patent application No. 2006-241331, filed on Sep. 6, 2006, the disclosure of which is incorporated herein in its entirety by reference.

BACKGROUND OF THE INVENTION

1. Field of the Invention

The present invention relates to a variable shaped electron beam lithography system for drawing a figure pattern including an oblique line with an arbitrary angle by forming a single electron beam shot in the same shape as the figure pattern, and a method for manufacturing a substrate.

2. Description of the Related Art

In a photo mask electron beam lithography system including an electron optical system having a 50 kV electron gun, a raster scan system and a variable shaped beam system (hereinafter, called "VSB system") have been developed, and at the present day, both of them are put into practical use. The raster scan system is, as shown in FIG. 1A, a system which scans a resist layer of a photographic dry plate (blank) by moving the position of a spot of beam irradiation 31 and by projecting electron beam 30 at a position of target drawing pattern 29. On the one hand, the VSB system is, as shown in FIG. 1B, a system which divides target drawing pattern 29 into a plurality of rectangular figures, forms electron beam shot 32 into an electron beam shape coincident with the divided rectangular figures for each of them, and draws patterns on a dry plate or a semiconductor wafer.

The raster scan system has higher drawing accuracy, but lower throughput because of a large number of shots. Therefore, in the field for manufacturing a critical photo-mask, the VSB system is primarily adopted because the VSB system is expected to draw a fine pattern of several hundred μm accurately at a high speed.

A lithography system of the VSB system, as shown in FIG. 2, forms an electron beam emitted from electron gun 1 into rectangular beam 7 through two apertures 101, 102. Then, the formed rectangular beam 7 is reduced by reducing lens system 6, and the deflection angle of the beam is changed by deflector 9 of object lens system 8 to converge and subject to a drawn target substrate 10.

Specifically, first aperture 101 and second aperture 102 for forming a beam are fixed as shown in FIG. 3, and they have a square opening portion in a plate to shield against an electron beam. Therefore, an electron beam which passed through opening portion 101a of first aperture 101 is formed into the same, square shape as opening portion 101a (FIG. 4 (a)). Then, the electron beam is shifted by deflector 5 of forming lens system 4 relative to XY rectangular coordinates of second aperture 102 in the X-axis direction and/or in the Y-axis direction, generating rectangular beam shape 11 formed by a common opening portion between two aperture 101, 102 (FIG. 3, FIG. 4 (b)). That is, by allowing only a part of the electron beam which passed through first aperture 101 to pass through opening portion 102a of second aperture 102, a desired, rectangular beam 7 is formed. Subsequently, rectangular beam 7 is reduced by reducing lens system 6 to project a desired, rectangular beam shot 12 onto the drawn target substrate 10 (FIG. 3, FIG. 4 (c)).

Nowadays, as an LSI pattern is made finer in higher integration, complexity in an LSI pattern shape drawn on a photo-mask is increased, and also the number of LSI patterns tends to be increased exponentially, as the process generation goes forward. This means that, in a process for directly drawing an LSI pattern on a dry plate or a semiconductor wafer, patterns to be drawn by a lithography system are enlarged, or the number of drawing figures divided into a rectangle by the VSB system is increased. This tendency may be a factor for largely lowering productivity, because the time period required to draw is approximately linearly increased corresponding to an increase in the number of figures.

On the one hand, in drawing a trapezoidal FIG. 13 in which both of the two opposite sides have an oblique line with an arbitrary angle, as shown in FIG. 5 (a), a beam formation method by the VSB lithography system shown in FIG. 2 cannot form an electron beam shot that has an oblique line relative to the rectangular coordinate axis of the target that is to be, drawn (hereinafter, called "drawing rectangular coordinate system"). Therefore, as shown in FIG. 5 (b), the trapezoidal figure is divided into a rectangular figure and a triangular figure, further the triangular figure is finely divided into a plurality of elongated rectangular figures, and single electron beam 14 is formed into a rectangular shape coincident with each of the divided figures, and converged and subjected, respectively. In addition, the lithography system (from NuFlare Technology, Inc., EBM series) normally equipped with the second aperture having an opening side at 45° angle can form a beam shot into a triangle having an oblique side at 45° angle, but cannot be applied, when the triangle has an oblique side at an arbitrary angle. Of course, if an aperture for drawing obliquely is provided, for now, it may be addressed, but an oblique side with any arbitrary angle may not be covered, then it cannot be an actual solution. Further, in the case of FIG. 15 obtained by rotating trapezoidal FIG. 13 shown in FIG. 5 (a) around the center of the figure by an arbitrary angle, as shown in FIG. 6 (a), all four oblique side portions have to be approximated by a plurality of elongated rectangular figures 16 parallel or vertical relative to the XY drawing rectangular coordinate system. Therefore, the total number of divided drawing figures of the figure shown in FIG. 6 (b) is largely increased compared to that of the figure shown in FIG. 5 (b).

In current design of LSI pattern, the mainstream is a system called "Manhattan System" in which a pattern is arranged along an X-axis or a Y-axis direction in the XY drawing rectangular coordinate system. While there have been significant advances in the wiring design of LSI patterns, an element arrangement in a direction that has an arbitrary angle is expected to be a useful means to allow a design region to be used effectively, but this arrangement is not permitted in the current Manhattan System. However, in addition to drawing a photo-mask having LSI design involving such oblique arrangement, in the case of forming a pattern of MEMS (micro Electro Mechanical Systems) or a pattern of a nanoimprinting mold for an optical element, a complex pattern using many oblique sides with an arbitrary angle has to be drawn. As the result, in a drawing process using the current VSB lithography system, the number of the divided drawing figures becomes enormous. Therefore, to improve productivity in this process, the largest, technical challenge is to reduce the number of the divided figures in order to shorten the drawing time.

Then, as for a method for forming an oblique pattern, there are technologies disclosed in Japanese Patent Laid-Open No. 61-255022 and No. 9-82630. In Japanese Patent Laid-Open No. 61-255022, there is disclosed a technology that, by rotating a first aperture and a second aperture shown in FIGS. 13 and 14 in synchronization with each other, a shape of a beam shot is formed into a rectangular pattern having two oblique sides opposite to each other. However, in this drawing method, the other two opposite sides except the opposite, oblique side portions do not become parallel or vertical to the XY drawing rectangular coordinate system. Therefore, there arises a problem of lack of versatility, because it is difficult to connect with rectangular shaped electron beam shot having four sides along the X/Y-axis direction in the XY drawing rectangular coordinate system.

Further, in Japanese Patent Laid-Open No. 9-82630, disclosed is a technology that, in a conventional VSB lithography system having the first and second fixed aperture as shown in FIGS. 2 and 3, a third rotatable aperture having a slit is provided. In this lithography system, in order to conform to a drawing figure pattern including two opposite, oblique sides parallel to each other that are inclined at an arbitrary angle, a rectangular beam formed by the first and second aperture is formed by the slit of the third aperture rotated up to an angle made between the parallel, oblique sides of the target drawing pattern, thereby the oblique side portions are formed. Two opposite sides, except the oblique side portions, are formed horizontally or vertically relative to the XY drawing rectangular coordinate system, by both the first and second aperture. In such a drawing system, a beam shape formed by the third aperture becomes a similar figure to a drawing figure, and the reduction rate in projecting onto a wafer etc. is represented by the ratio of the distance between two oblique sides of a target drawing figure, to the slit width (fixed value) of the third aperture. Therefore, the reduction rate of the formed beam has to be changed, every time a size of the divided figures to be drawn becomes different, and a settling time required for calibration for each reduction rate adjustment is accompanied. Further, when the target drawing figure is in a trapezoidal shape in which opposite oblique sides have an arbitrary angle and are not parallel to each other (FIG. 5 (b), FIG. 6 (b)), the number of divided figures involved in drawing a figure pattern is increased.

The total required drawing time of the VSB system is approximately represented as the product obtained by multiplying the sum of the settling time necessary for a system to deflect a beam for each drawing and the beam emission time in drawing figures (in exposing resist) by the total number of figures to be drawn. Therefore, the larger the total number of drawing figures is, the more the total drawing time is increased.

Further, in the conventional VSB lithography system which divides a drawing figure pattern having opposite, oblique line portions that are inclined at an arbitrary angle into a rectangular figure, and which converges and emits a formed beam for each rectangular figure, the total drawing time is prolonged linearly due to an increase in the total number of divided figures. Therefore, compared to a drawing figure pattern having a completely rectangular shape the side of which are each parallel or vertical relative to the X-axis or the Y-axis direction in the XY drawing rectangular coordinate system, in a drawing figure such as a parallelogram, a trapezoid, and a rotated trapezoid formed by rotating the trapezoid around the center of the figure, the number of rectangular figures approximating oblique side portions is increased, and the total drawing time is prolonged accordingly. To shorten the total drawing time, setting a size of a divided rectangular figure to be coarse may be also effective, but on the other hand, approximate accuracy in oblique side portions is degraded, so that it cannot be a fundamental solution.

SUMMARY OF THE INVENTION

An object of the present invention is to achieve a drawing figure pattern based on the very small number of divided figures compared to that of a related art in order to largely shorten the total drawing time, in drawing, by the VSB system, a figure pattern including an oblique line figure portion including two opposite, oblique lines, each forming an arbitrary, different angle relative to a coordinate axis in an XY drawing rectangular coordinate system. In addition, "XY drawing rectangular coordinate system" means a rectangular coordinate system for representing the shape and position of a figure pattern to be drawn on a drawn target substrate such as a dry plate or a semiconductor wafer, and a lithography system also has a rectangular coordinate system corresponding to it, and in drawing figure patterns, the rectangular coordinate system is used to control hardware, such as an aperture, based on figure pattern information. Further, "oblique line, each forming an arbitrary, different angle relative to a coordinate axis of the XY drawing rectangular coordinate system" or "oblique side" means that a side of a drawing figure pattern forms an arbitrary angle relative to the X-axis direction/the Y-axis direction in the XY drawing rectangular coordinate system except when it is parallel or vertical.

According to the present invention, to achieve the object described above, when a figure pattern to be drawn on a drawn target substrate includes an oblique line figure portion including two opposite, oblique lines, each forming an arbitrary, different angle relative to the coordinate axis in the XY drawing rectangular coordinate system, a single electron beam is formed into the same shape as the oblique line figure portion so as to draw the figure pattern.

Further, when the figure pattern described above is a ring pattern, the drawing region between an outer peripheral line and an inner peripheral line of the ring pattern is equally divided into a plurality of the same trapezoidal figures in order to approximate the drawing region, and a single electron beam is formed for each of the trapezoidal figures divided into the same shape as the trapezoidal figure so as to draw each of the trapezoidal figures in sequence.

To draw the oblique line figure and the trapezoidal figure as described above, a variable shaped electron beam lithography system according to the present invention is configured as follows.

That is, the lithography system of the present invention includes a first, second and third aperture for forming a single electron beam in each of the rectangular opening portions that are provided, and draws a figure pattern using a single electron beam shot formed by sequentially passing the beam through the first, second and third aperture in sequence. In each of the first and second aperture described above, a rotary drive mechanism is provided, which rotationally drives the aperture around an optical axis up to an arbitrary angle from 0 to 360°. Further, in the third aperture, a variable slit width mechanism is provided, which varies an opening slit width of the rectangular opening portion provided in the aperture.

This lithography system operates as follows, when a figure pattern that includes two opposite, oblique sides, each which forms an arbitrary angle relative to the coordinate axis in the XY drawing rectangular coordinate system (a figure such as a triangle, parallelogram or trapezoid), is drawn on a drawn target substrate.

A position at which each side of the rectangular opening portion of each aperture becomes parallel or vertical to the coordinate axis in the XY drawing rectangular coordinate system is defined as a rotary reference for each aperture. The first aperture is rotated from the rotary reference by an angle coincident with an angle of one of the two oblique sides, and the second aperture is rotated from the rotary reference by an angle coincident with an angle of the other of the two oblique sides. Then, a single electron beam is formed into a shape of the figure pattern using the rectangular opening portions of the first and second aperture that has been rotated, and the rectangular opening portion of the third aperture, and the single electron beam is projected onto the drawn target substrate. In addition, the drawn target substrate means a dry plate (blank) or a semiconductor wafer etc.

Further, the lithography system configured in the way described above operates as follows, in drawing, on the drawn target substrate, a figure pattern (trapezoidal figure) which is a quadrangle and which is composed of two opposite, oblique sides, each forming an arbitrary angle relative to the coordinate axis in the XY drawing rectangular coordinate system and two opposite, parallel sides parallel or vertical to the coordinate axis in the XY drawing rectangular coordinate system.

The first aperture is rotated from the rotary reference described above by an angle coincident with an angle of one of the two oblique sides described above, and the second aperture is rotated from the rotary reference by an angle coincident with an angle of the other of the two oblique sides. Further, the opening slit width of the rectangular opening portion of the third aperture is changed to a dimension obtained by multiplying the distance between the two parallel sides by the inverse of the reduction rate of a reduction lens system for reducing and projecting the single electron beam on the drawn target substrate, which was formed by passing the electron beam through the first, second and third aperture in turn.

Then, the single electron beam is formed into a shape of the figure pattern of the quadrangle by using the rectangular opening portions of the first and second aperture that has been rotated, and by using the rectangular opening portion of the third aperture. Subsequently, the formed single beam is reduced by the reduction lens to be the same size as the figure pattern, and is projected onto the drawn target substrate.

Further, the lithography system configured as described above, preferably, further includes a rotary drive mechanism for rotationally driving the third aperture around an optical axis up to an arbitrary angle from 0 to 360°.

Also, this lithography system can draw a rotated figure pattern (rotated trapezoidal figure) formed by rotating the figure pattern of the quadrangle described above around the center of the figure thereof by an arbitrary angle. In this case, the lithography system can form the single electron beam into a shape of the rotated figure pattern, by rotating each aperture from the rotary reference by the value which is summed the rotation angle of each aperture when the figure pattern of the quadrangle is drawn, and the same angle as a rotation angle of the rotated figure pattern.

According to the present invention described above, even a figure pattern (for example, a trapezoidal figure) including two opposite, oblique sides, each forming a different arbitrary angle relative to the coordinate axis in the XY drawing rectangular coordinate system, can be drawn all together by a single beam that has been formed, without dividing into a plurality of figures. Therefore, a figure pattern including a trapezoidal figure etc. can be accurately drawn, and the total drawing time can be largely shortened.

The above and other objects, features and advantages of the present invention will become apparent from the following description with reference to the accompanying drawings which illustrate examples of the present invention.

DESCRIPTION OF THE EXEMPLARY EMBODIMENT

Figure 1A:
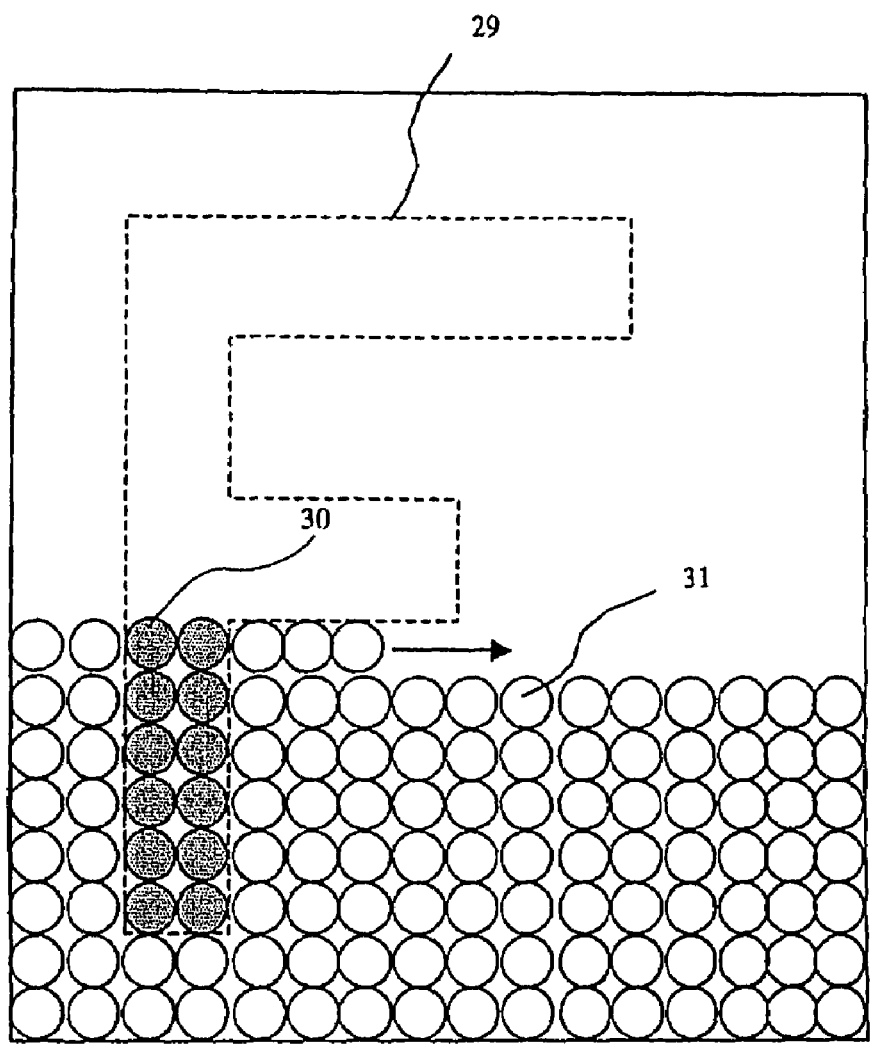
FIG. 1A is a view for describing a raster scan system using a conventional electron beam drawing method.
Figure 1B:
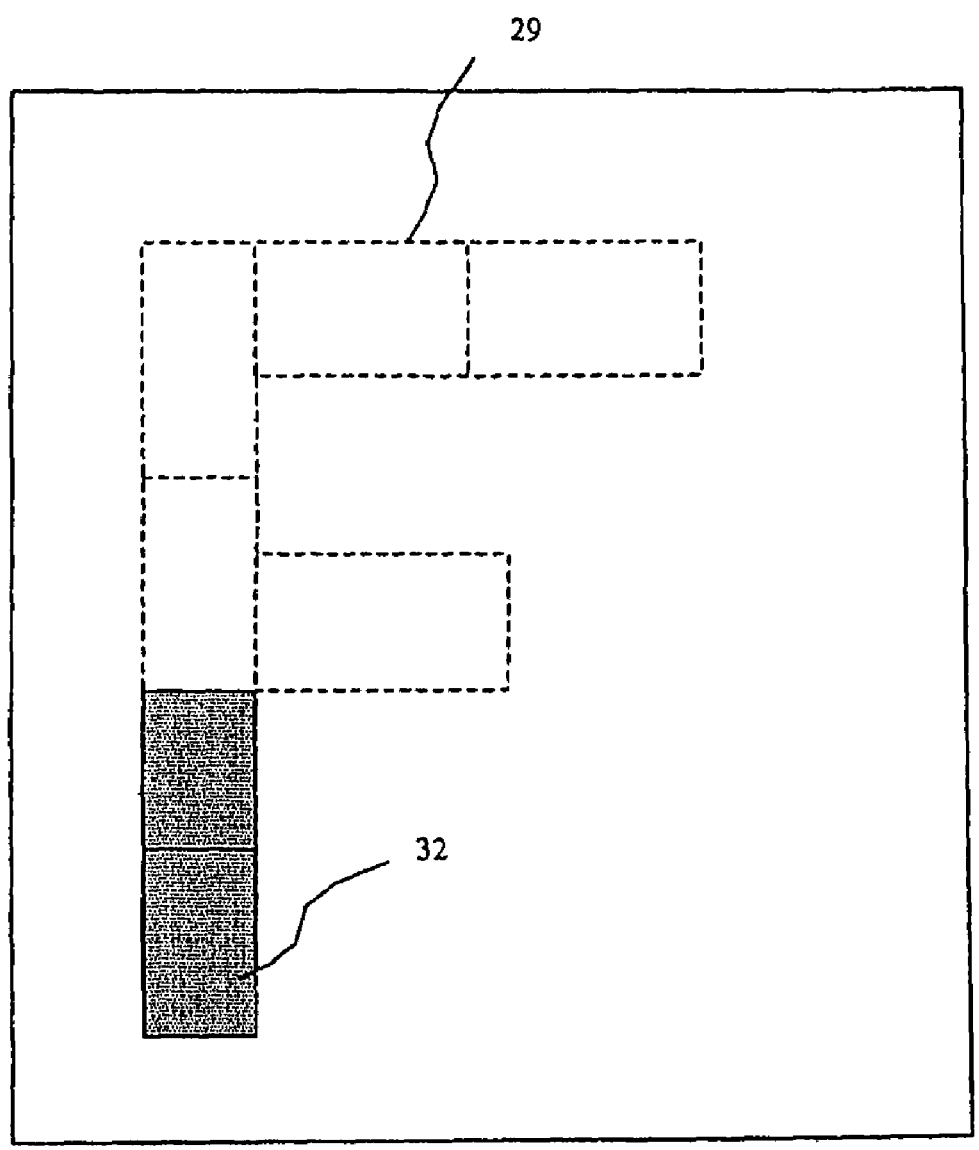
FIG. 1B is a view for describing a VSB system using a conventional electron beam drawing method.
Figure 2:
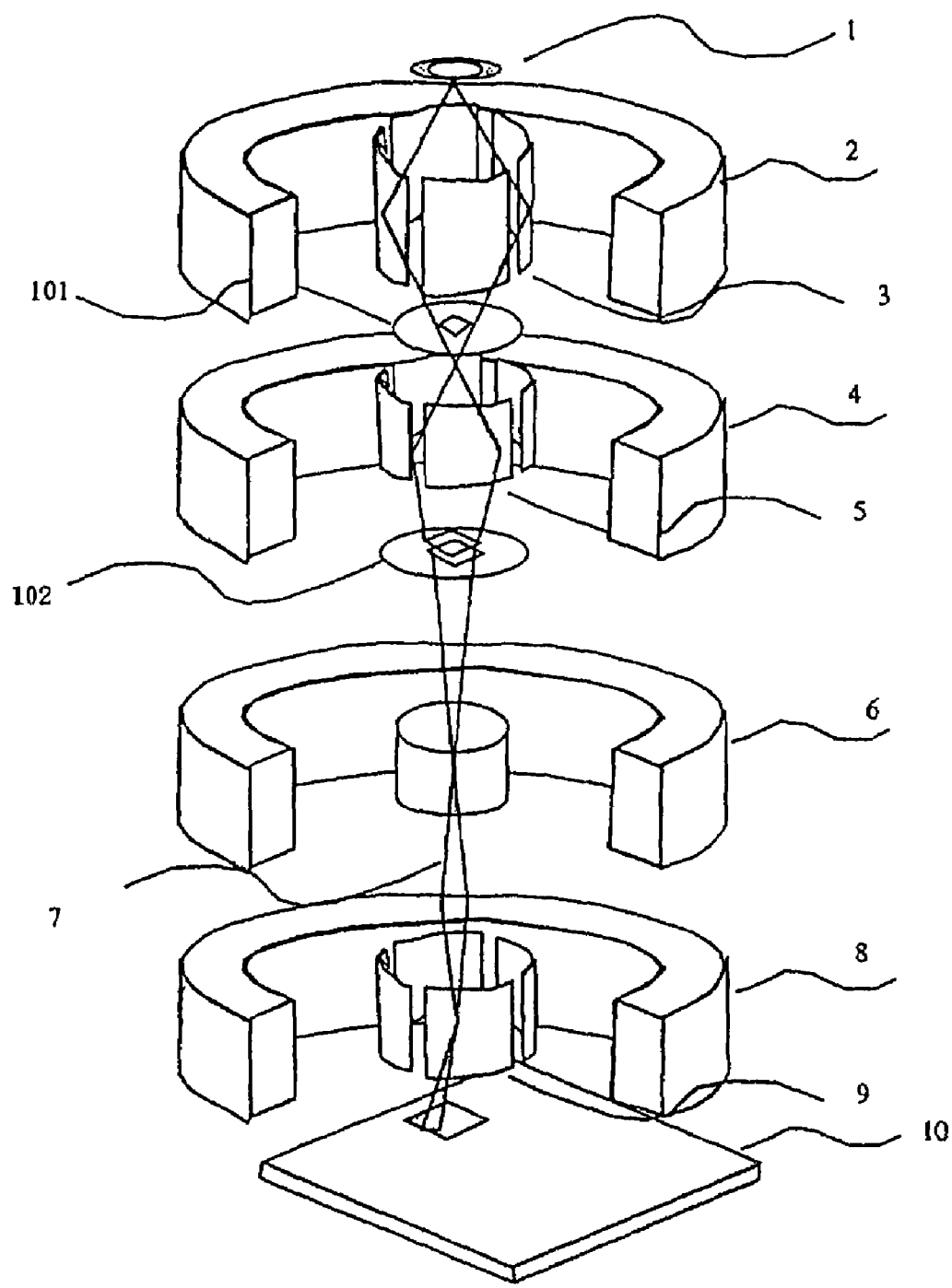
FIG. 2 is a schematic diagram illustrating a rough configuration of a conventional VSB lithography system.
Figure 3:
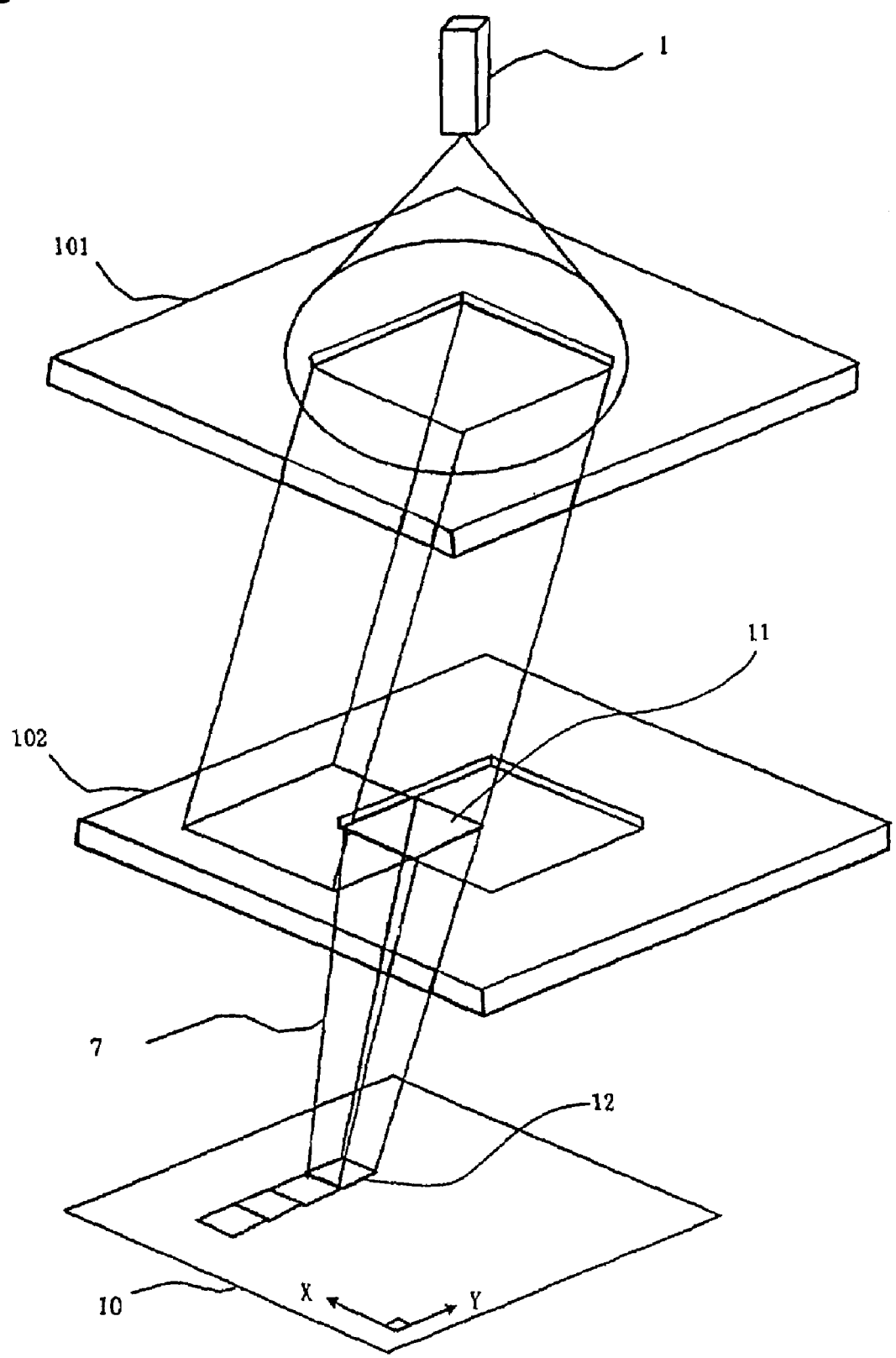
FIG. 3 is a schematic diagram illustrating a forming mechanism of an electron beam in the conventional VSB lithography system.
Figure 4:
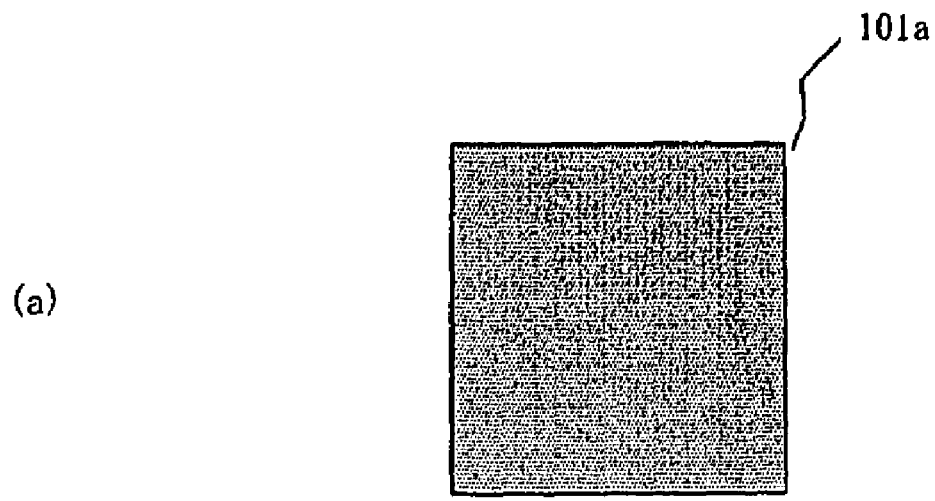
FIG. 4 is a schematic diagram illustrating a method for forming an electron beam in the conventional VSB lithography system.
Figure 4:
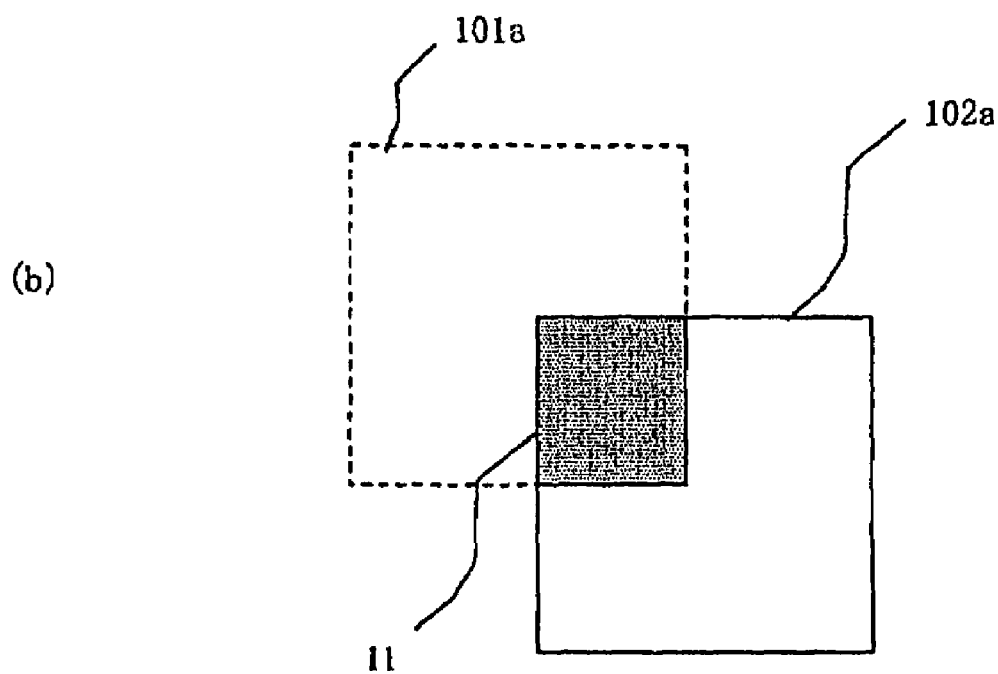
Figure 4:
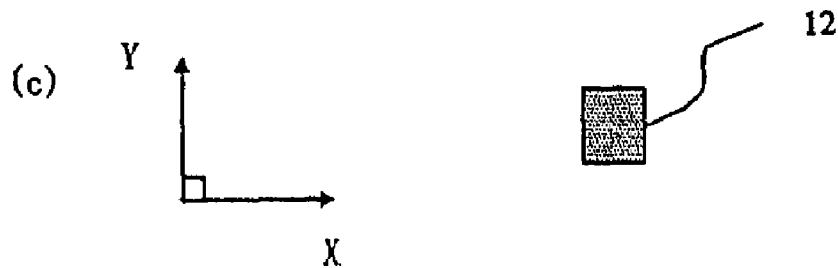

Now, a description will be provided, using the same symbols with respect to the same functional components in the lithography system (FIG. 2, FIG. 3) described in the related art.

Figure 7:
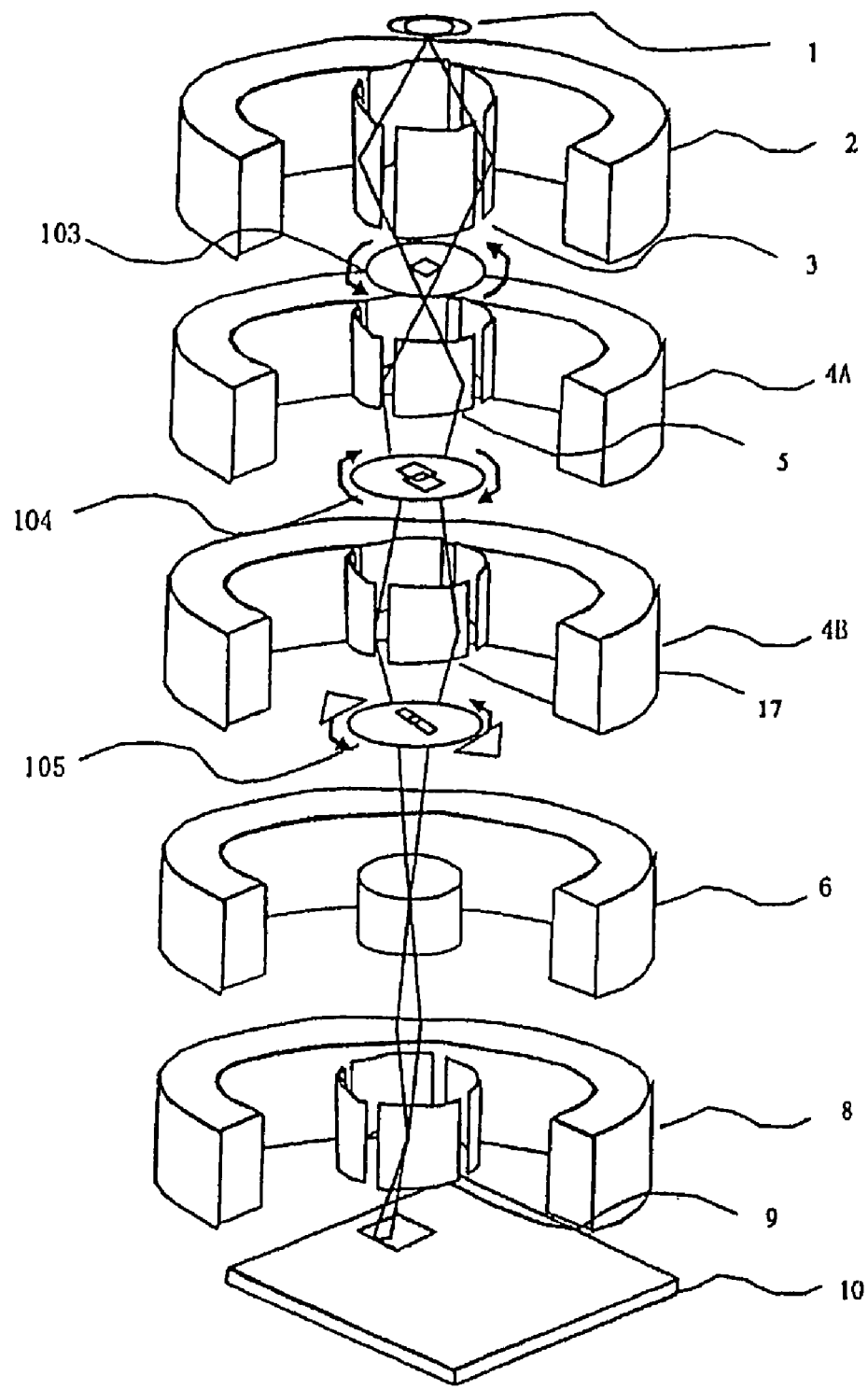
FIG. 7 is a schematic diagram illustrating a rough configuration of a VSB lithography system according to an exemplary embodiment.

A lithography system of this exemplary embodiment uses a VSB system. Referring to FIG. 7, an electron gun 1, an illuminating lens system 2, a first aperture 103, a first forming lens system 4A, a second aperture 104, a second forming lens system 4B, a third aperture 105, a reduction lens system 6, an object lens system 8, and a drawn target substrate (a dry plate or a semiconductor wafer) 10 are provided in this order in the beam emission direction of the electron gun 1. In addition, illuminating lens system 2, first forming lens system 4A, second forming lens system 4B, reduction lens system 6, and object lens system 8 respectively have deflectors 3, 5, 17, and 9 for deflecting a beam.

Each of first aperture 103, second aperture 104 and third aperture 105 for forming an electron beam has an opening portion in a plate to shield against an electron beam, respectively. Then, each aperture 103, 104, 105 is adapted to be able to independently rotate in both the counterclockwise and clockwise direction around the center of the aperture opening made coincident with optical central axis 18, i.e. the optical axis of this lithography system (FIG. 8), as a basic axis, within a range from 0 to 360°. As for a mechanism for rotationally driving these apertures 103, 104, 105, for example, a configuration for rotating and controlling a plate, as an aperture rotatably installed within a range from 0 to 360° around the center of the aperture opening as a basic axis, using a motor and a gear may be applied.

Figure 8:
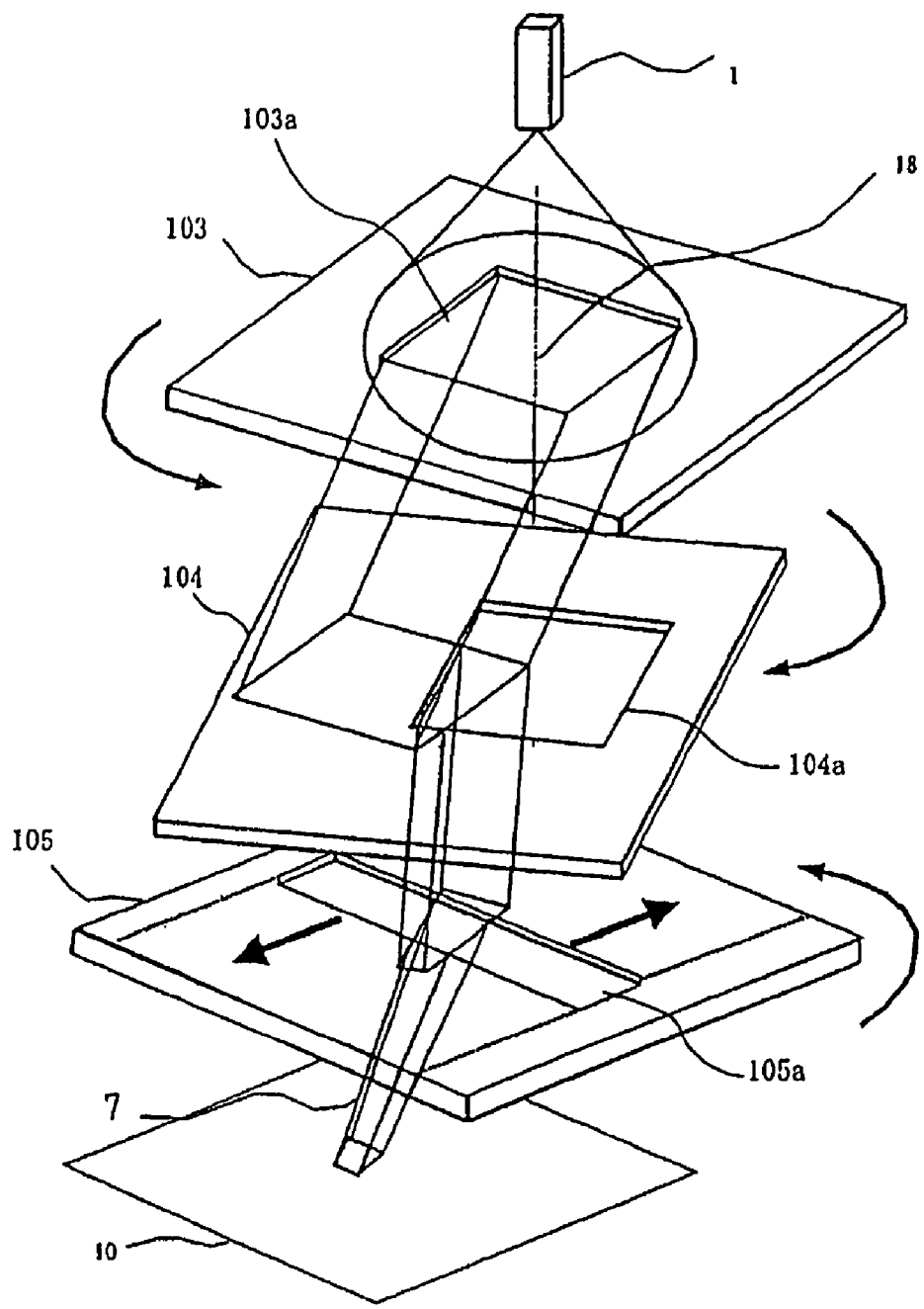
FIG. 8 is a schematic diagram illustrating a forming mechanism of an electron beam in the VSB lithography system of FIG. 7.
Figure 9:
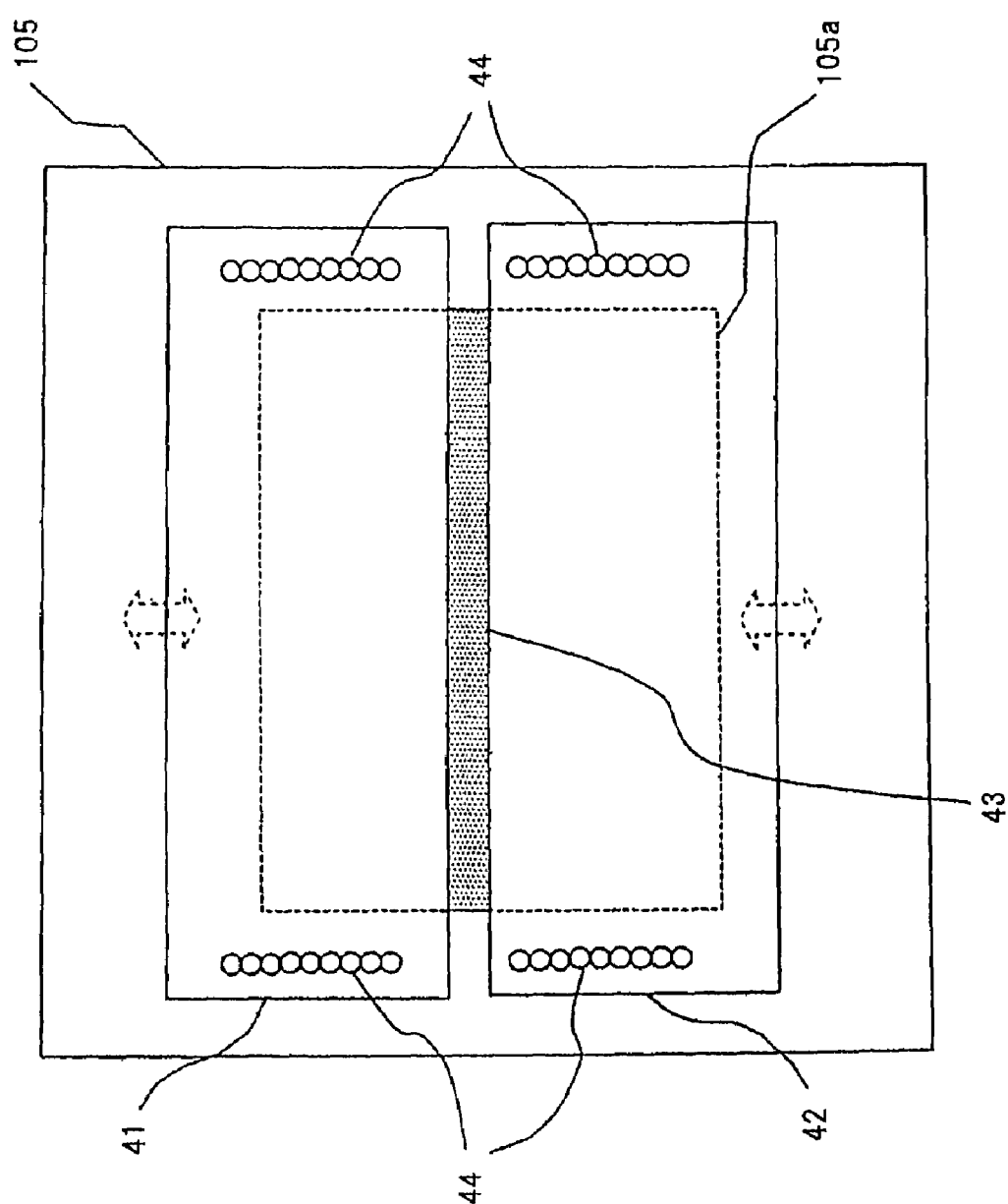
FIG. 9 is a plan view for describing an exemplary embodiment of a variable slit width mechanism for a third aperture in the VSB lithography system of FIG. 7.
Figure 10:
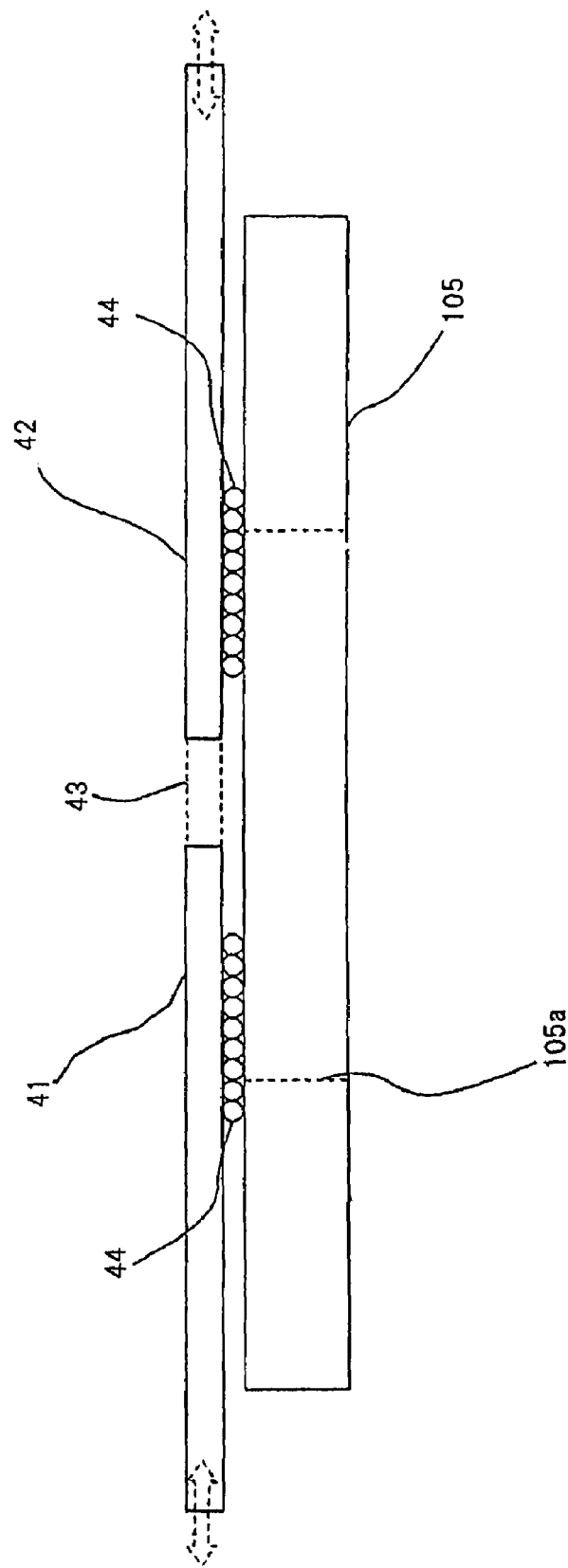
FIG. 10 is a side view of the third aperture of FIG. 9.

As shown in FIG. 8, the opening portions 103a, 104a of first and second aperture 103, 104 are square, and shapes of the opening portions are not changed. On the contrary, the opening portion 105a of third aperture 105 is an opening portion in a slit shape, and the width of the slit is adapted to be varied. Specifically, as shown in FIGS. 9 and 10, third aperture 105 has a large, rectangular opening, and a pair of shielding plates 41, 42 is disposed on third aperture 105 so as to cover the rectangular opening. The pair of shielding plates 41, 42 is disposed so that end sides thereof abut on each other, and opening slit 43 is formed by making a gap between the end sides by shifting the plates in the opposite direction in synchronization with each other. For that purpose, each of shielding plates 41, 42 is disposed on third aperture 105 slidably in one direction (the direction shown by the arrow in a dotted line) using ball bearing 44. As for a mechanism for moving each of shielding plates 41, 42 close to, or away from each other in synchronization with each other, for example, there may be applied a configuration for rotating and controlling a pinion gear by a motor, the pinion gear being engaged between rack rails fixed on each of the shielding plates. By moving shielding plates 41, 42 close to, or away from each other in synchronization with each other using such construction, the slit opening width formed between the shielding plates 41, 42 can be varied.

In the lithography system of this exemplary embodiment, as shown in FIGS. 7 and 8, an electron beam emitted from the electron gun 1 is passed through three apertures 103, 104, 105 to be formed into the shape of a drawing figure pattern. Then, formed beam 7 is reduced by reduction lens system 6, the deflection angle of the beam is changed by deflector 9 of object lens system 8, and then the beam is converged and projected onto the drawn target substrate 10 such as a semiconductor wafer or a dry plate. According to this system, formed beam 7 can be formed into various figures having an oblique side that forms an arbitrary angle relative to the XY drawing rectangular coordinate system.

Figure 11:
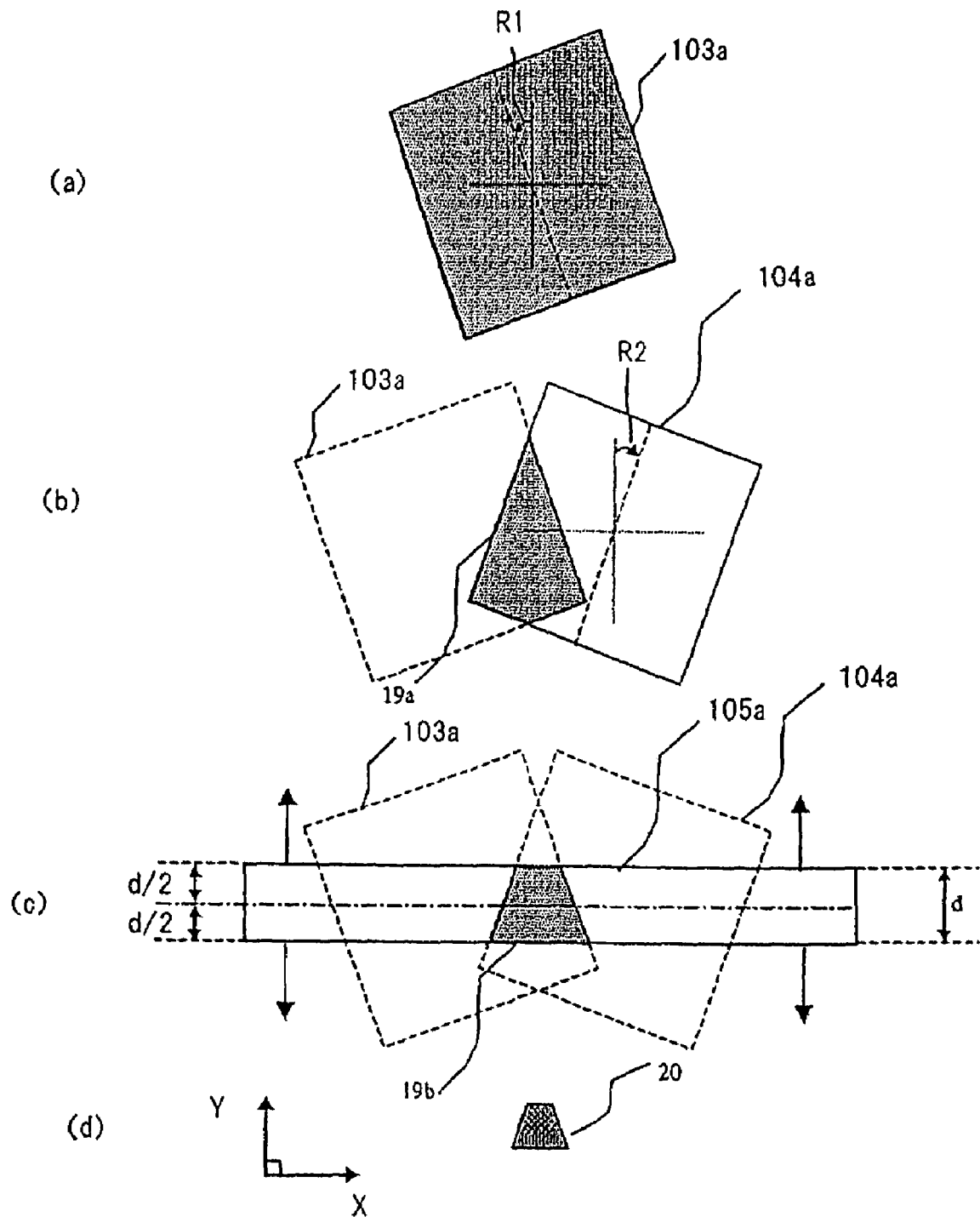
FIG. 11 is a schematic diagram illustrating a method for forming an electron beam in the VSB lithography system of FIG. 7 and FIG. 8.

For example, in drawing a drawing FIG. 20 (trapezoidal pattern) 20 by a single electron beam, as shown in FIG. 11 (d) and that includes two opposite, nonparallel oblique sides having an arbitrary angle and having two sides parallel to each other, and parallel or vertical to the XY drawing rectangular coordinate system, a figure is formed as following:

First, based on angle data (tilt angle R1) of an oblique side shown on the right side of the target drawing FIG. 20 relative to the XY drawing rectangular coordinate system, first aperture 103 is rotated counterclockwise by tilt angle R1 (FIG. 11 (a)). On the other hand, based on angle data (tilt angle R2) of an oblique side shown on the left side of drawing FIG. 20 relative to the XY drawing rectangular coordinate system, second aperture 104 is rotated clockwise by tilt angle R2. In addition, a rotary reference position for each of apertures 103, 104 is a position at which each side of the square, opening portions 103a, 104a becomes parallel or vertical to the XY drawing rectangular coordinate system.

Next, an electron beam which passes through opening portion 103a of first aperture 103 to be projected onto second aperture 104 is shifted in the X and/or Y-direction relative to the XY drawing rectangular coordinate system using deflector 5 of forming lens system 4. Accordingly, a common opening portion between the two apertures 103, 104 forms beam shape 19a having two oblique sides that are inclined at an arbitrary angle and are nonparallel to each other (FIG. 11 (b)).

Further, an electron beam formed into beam shape 19b by passing through second aperture 104 is formed by opening portion 105a in the slit shape of third aperture 105. Accordingly, there is provided beam shape 19b having, in addition to the two nonparallel, oblique sides that are inclined at an arbitrary angle, two sides parallel to each other and parallel or vertical to the XY drawing rectangular coordinate system. At this time, third aperture 105 is not rotated and remains at the rotary reference position, and shielding plates 41, 42 are moved in the opposite direction by d/2, forming a slit having an opening width of d. At the rotary reference position of third aperture 105, the long side of the slit is parallel to the X-axis direction in the XY drawing rectangular coordinate system.

Subsequently, rectangular beam 7 which passed through third aperture 105 is reduced by the reduction lens system 6, and a beam shot of target drawing FIG. 20 is projected onto drawn target substrate 10.

In addition, the slit opening width d of third aperture 105 for forming beam shape 19b is set to a dimension obtained by multiplying the distance between two sides parallel to each other, and parallel or vertical to the XY drawing rectangular coordinate system in target drawing FIG. 20, by the inverse of the reduction rate (fixed value) of reduction lens system 6. That is, beam shape 19b is formed so as to approximate the shape of target drawing FIG. 20 by using a scale multiplied by the inverse of the reduction rate (fixed value). Further, based on figure data of target drawing FIG. 20, to obtain beam shape 19b described above, the deflection position of a beam projected onto second aperture 104 or third aperture 105 is also determined.

Figure 12:
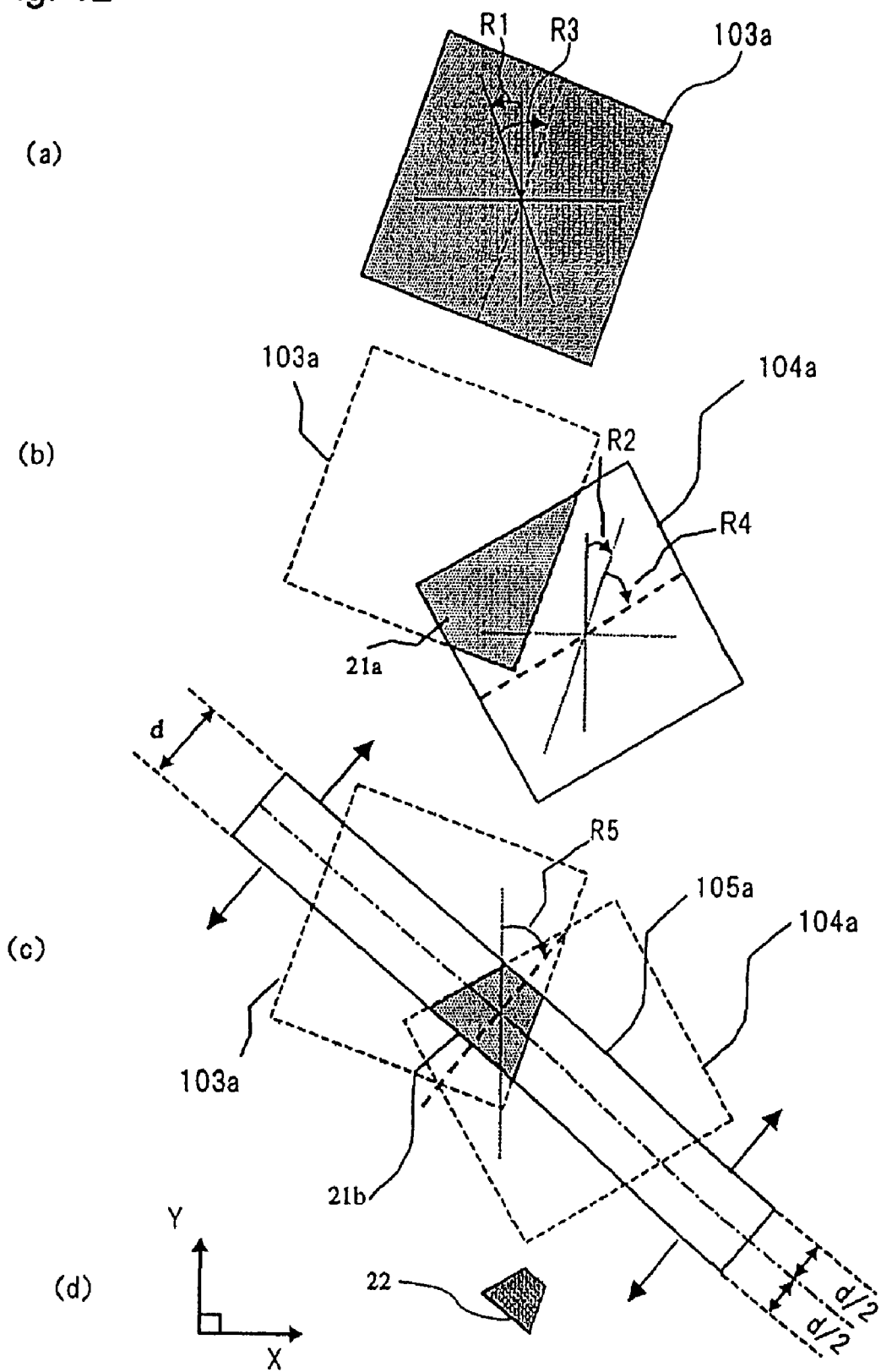
FIG. 12 is a schematic diagram illustrating the method for forming an electron beam in the VSB lithography system of FIG. 7 and FIG. 8.

On the other hand, in drawing drawing figure 22 (FIG. 12 (d)) obtained by rotating drawing figure 20 shown in FIG. 11 (d) around the center of the figure thereof clockwise by an arbitrary angle (R3=R4=R5) as shown in FIG. 12 (d), the figure is formed as follows.

First, first aperture 103 is rotated clockwise by an angle (R1+R3) (FIG. 12 (a)), second aperture 104 is rotated clockwise by angle (R2+R4) (FIG. 12 (b)), and third aperture 105 is rotated clockwise by angle R5 (FIG. 12 (c)). That is, by a value obtained by respectively adding the same value to the rotation angle of each of apertures 103, 104, 105 set when drawing figure 20 shown in FIG. 11 (d) is formed, each of apertures 103, 104, 105 is rotated. Accordingly, as shown in FIG. 12 (c), beam shape 21b formed by rotating beam shape 19b shown in FIG. 11 (c) by arbitrary angle (R3=R4=R5) can be obtained.

In addition, in the case of the first drawing of drawing FIG. 22, based on angle data of each side of target drawing FIG. 22 relative to the XY drawing rectangular coordinate system, the rotation angle of each of the apertures 103, 104, 105 may be determined. For example, two sides parallel to each other included in drawing FIG. 22 have an arbitrary angle (R3=R4=R5) relative to the XY drawing rectangular coordinate system.

Figure 5:
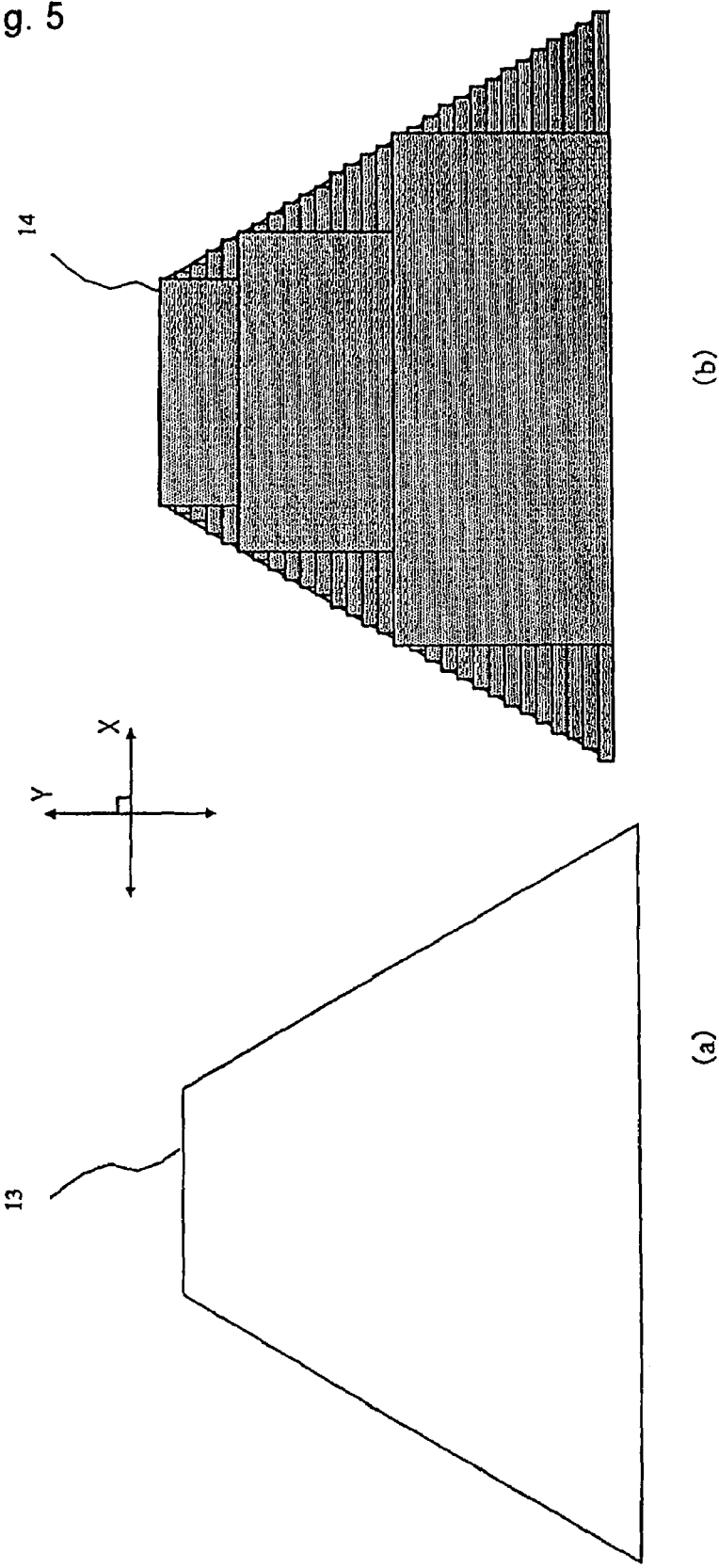
FIG. 5 is a view illustrating a figure that is drawn in a trapezoidal shape in the conventional VSB lithography system.
Figure 6:
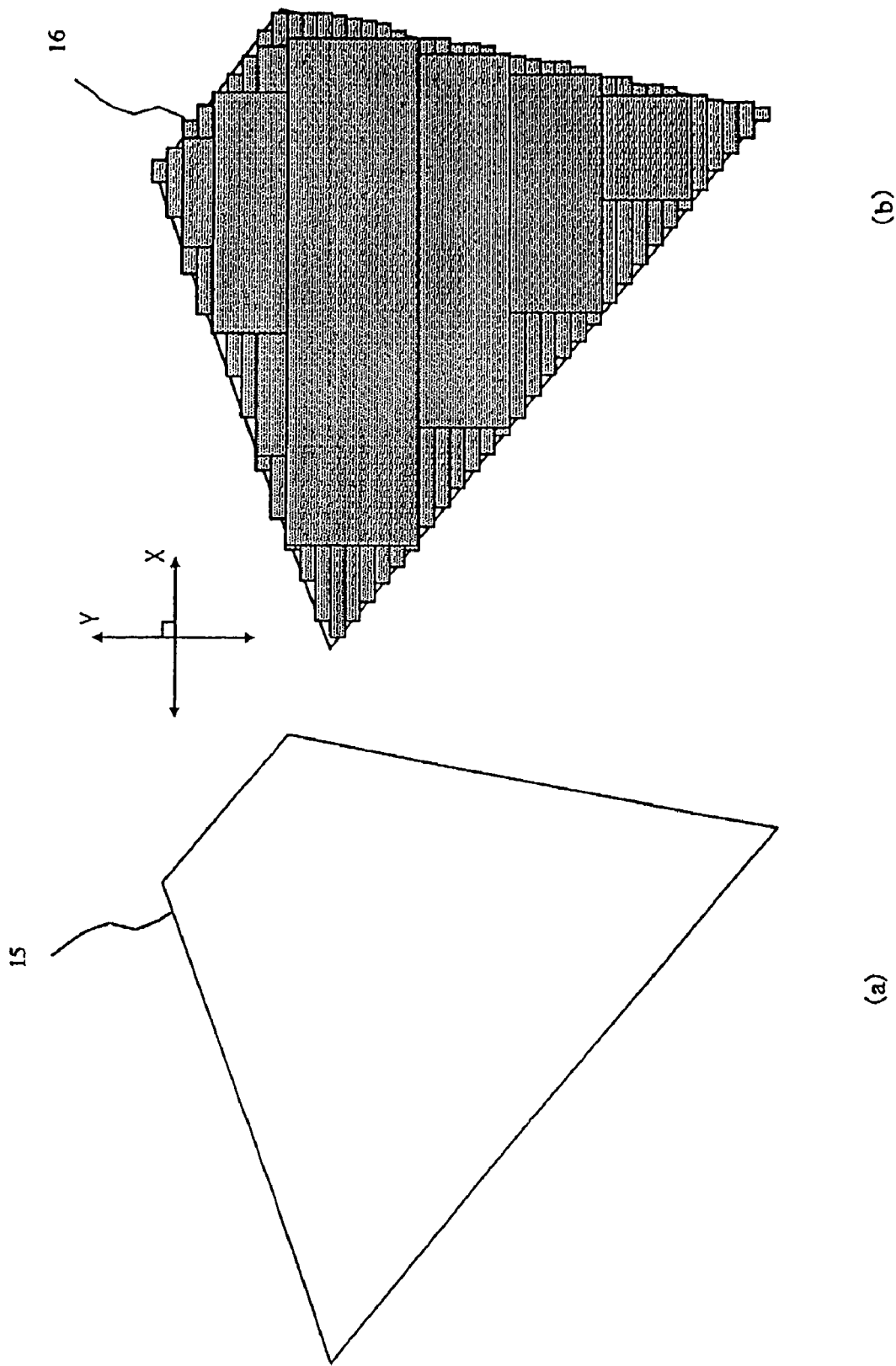
FIG. 6 is a view illustrating a figure that is drawn in a trapezoidal shape, rotated by an arbitrary angle, is drawn in the conventional VSB lithography system.

Using the VSB lithography system configured as described above, a drawing figure in a trapezoidal shape having a pair of two opposite, nonparallel, oblique sides with an arbitrary angle, as well as a drawing figure obtained by rotating the trapezoidal drawing figure around the center thereof by an arbitrary angle can be drawn all together by a single beam, without the need to divide a drawing region into a plurality of drawing figures as conventionally (FIG. 5 (b), FIG. 6 (b)).

Figure 13:
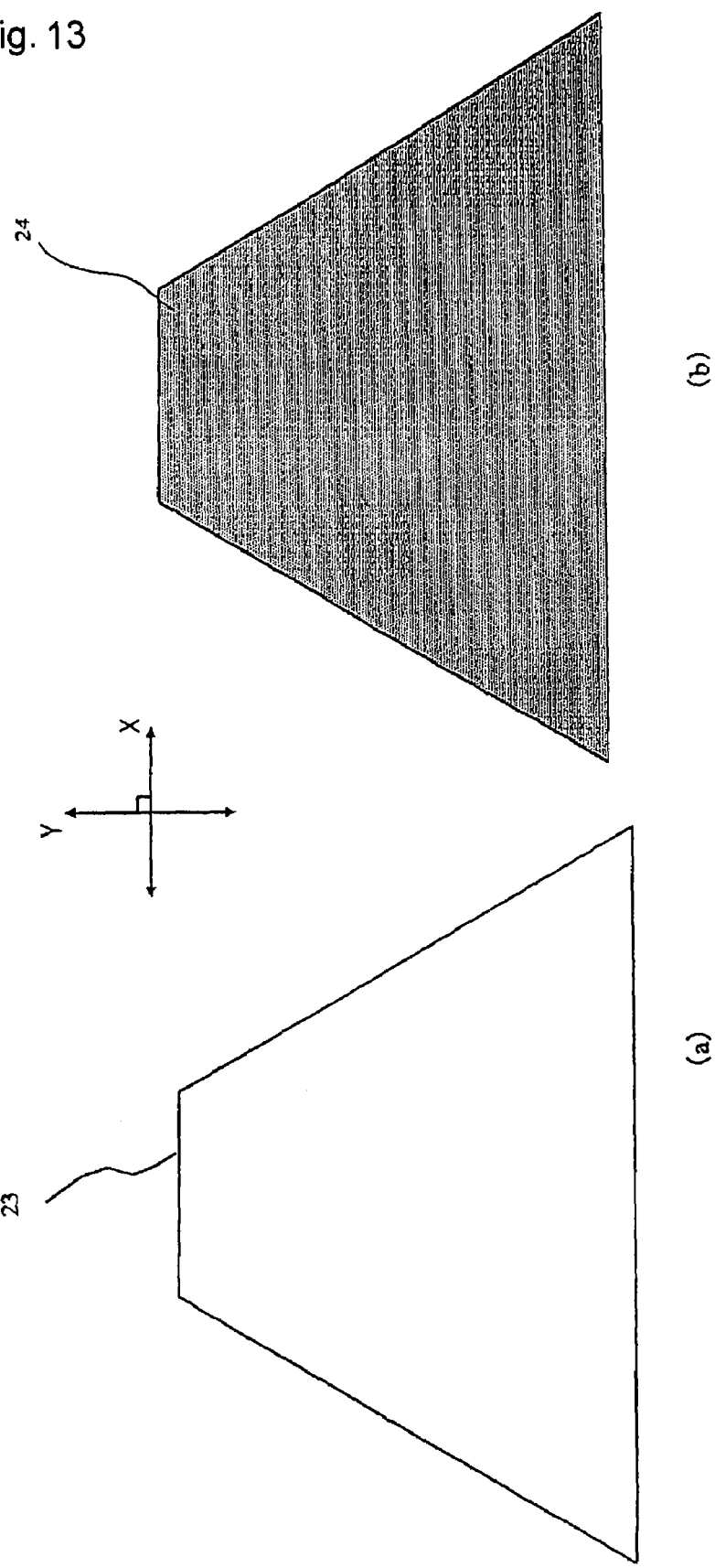
FIG. 13 is a view illustrating a trapezoidal figure that is drawn by the VSB lithography system of the present invention.
Figure 14:
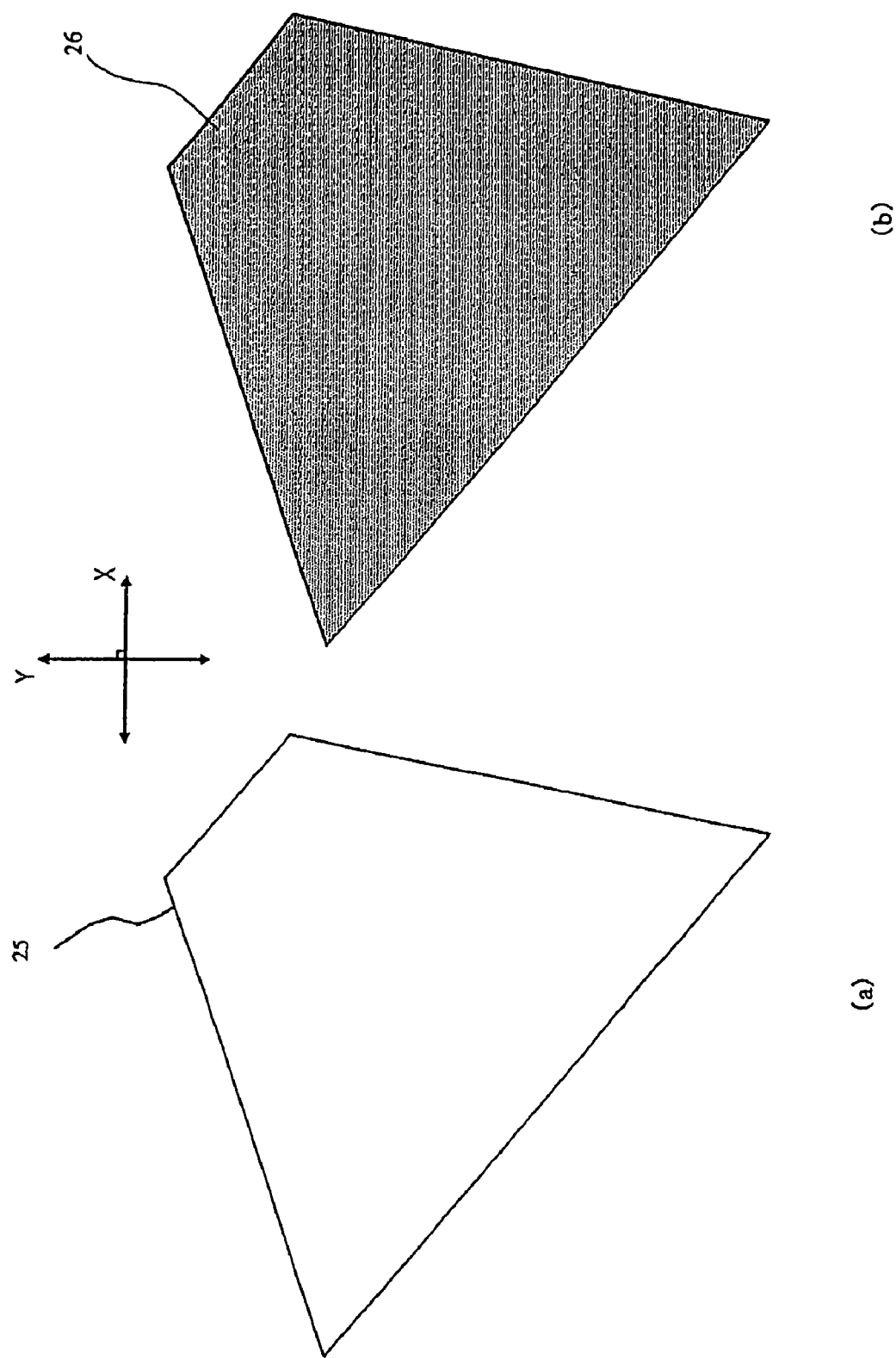
FIG. 14 is a view illustrating a rotated trapezoidal figure that is drawn by the VSB lithography system of the present invention.

Further, specifically, in a conventional VSB lithography system, when drawing figures 23, 25 shown in FIG. 13 (a), FIG. 14 (a) are drawn, it is necessary to divide a drawing region including an oblique line portion as shown in FIG. 5 (b), FIG. 6 (b) into an elongated, rectangular figure horizontal or vertical relative to the XY drawing rectangular coordinate system, to form a single beam for each of divided figures to draw them in turn. On the contrary, in the VSB lithography system according to the present invention, a single beam can be, as shown in FIG. 13 (b), FIG. 14 (b), formed into the same shape 24, 26 as drawing figures 23, 25, therefore the drawing figures can be drawn all together by the single beam.

Such a large decrease in the number of divided drawing figures can contribute to a significant reduction in the total drawing time. In the manufacturing field of a photo-mask having an LSI pattern whose shape has increased in complexity, this allows for a dramatic reduction in manufacturing cost of a photo-mask. Of course, this may be expected to be highly effective for improving the productivity of MEMS or a mold for nanoimprinting of optical elements that is required to form a complex pattern using many oblique sides that have an arbitrary angle.

In addition, obviously, the VSB lithography system of the present exemplary embodiment can draw a trapezoid or a rotated trapezoidal figure at a time which were not drawn at once by a conventional system, as well as a figure pattern such as a square, a parallelogram and a triangle by controlling the rotation angle of the first to third aperture or the slit width of the third aperture.

Further, the exemplary embodiment described above will be described in detail.

In the VSB lithography system according to the present invention, for processing data of a drawing figure pattern having an oblique line that is inclined at an arbitrary angle, the drawing figure pattern is divided into a plurality of figures by using a maximum beam size allowed to be formed, which is a minimum unit. Among the divided figures, a figure having an oblique line that is inclined at an arbitrary angle is drawn at once by forming a single beam into a shape of the figure using three apertures 103, 104, 105 configured as described above. As a general rule, the maximum beam size allowed to be formed is the upper limit of the single beam, and only drawing data whose size is not smaller than this is divided into a figure as large as possible within the maximum beam size. At this time, if a portion having an oblique side that is inclined at an arbitrary angle is present, the portion is divided into either a triangle, a parallelogram, or a trapezoid including the oblique side that is inclined at an arbitrary angle. In this case, there is no condition in which one side or two sides constituting each of the divided figures are parallel or vertical relative to the X and/or Y-axis in the XY drawing rectangular coordinate system.

The lithography system according to the present invention creates data of a drawing figure to be drawn at once, using a figure division/data generation algorithm described above and a software program coding the algorithm. Then, a single beam is formed based on the drawing figure data, and a beam that has been subsequently formed is converged and projected onto a dry plate (blank) or a wafer. In addition, a specific configuration for once drawing a drawing figure pattern having an oblique side that is inclined at an arbitrary angle in the XY drawing rectangular coordinate system by a single beam is as described with reference to FIG. 7 to FIG. 12.

Next, an exemplary embodiment of division of a drawing figure pattern in the lithography system of the present invention will be described.

Figure 15:
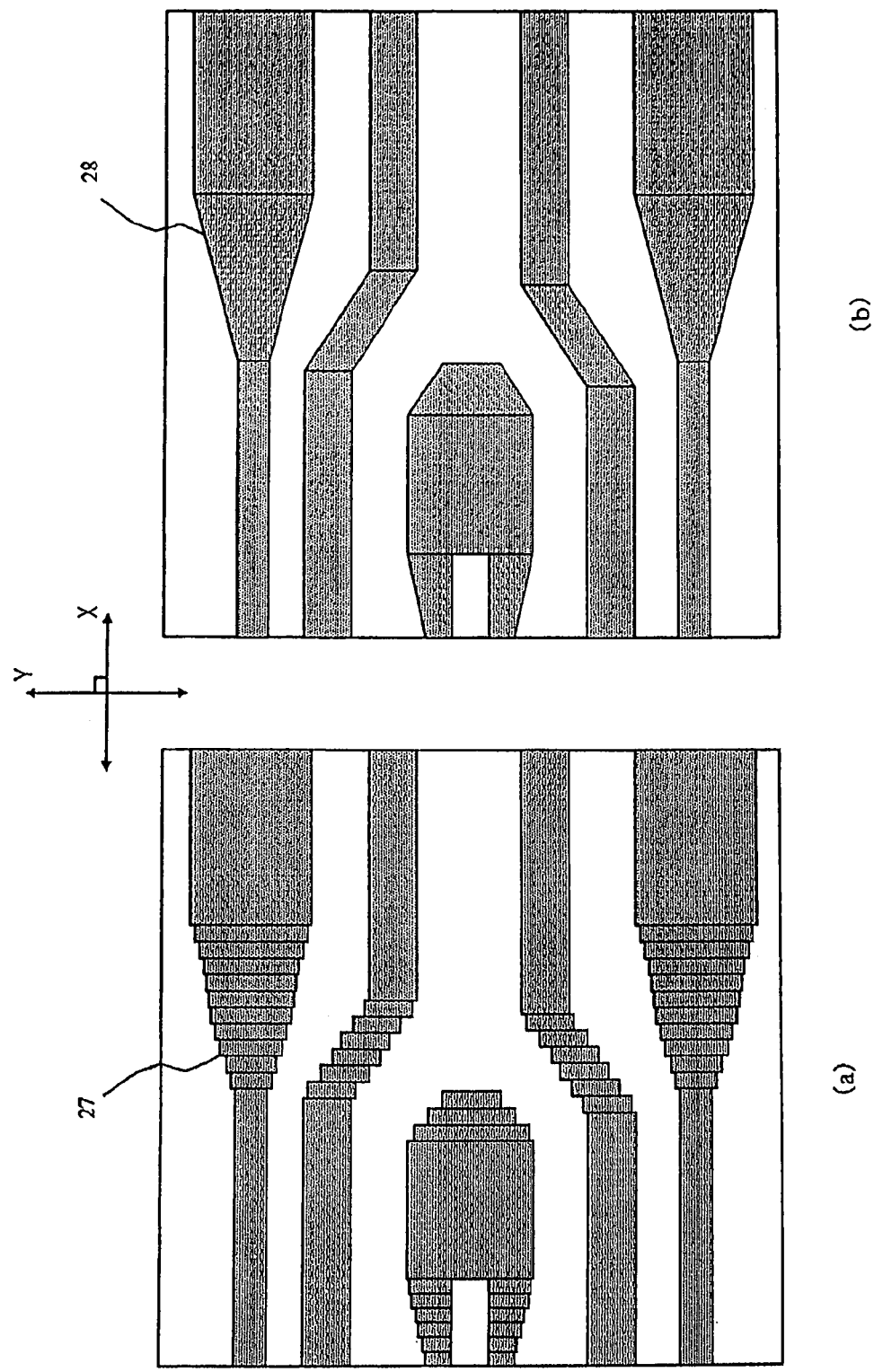
FIG. 15 is a view illustrating an exemplary embodiment for figure division of an LSI wiring pattern having an oblique line that is inclined at an arbitrary angle in a drawing system of the present invention.

FIG. 15 illustrates an example of an LSI wiring pattern having an oblique line that is inclined at an arbitrary angle.

When the LSI wiring pattern as shown is drawn by an electron beam, in a conventional VSB lithography system, all pattern portions having an oblique side that is inclined at an arbitrary angle are finely divided into a plurality of rectangular figures 27 as shown in FIG. 15 (a), thereby an oblique side portion of the pattern portion is approximated by using fine step portions formed of the plurality of rectangular figures 27. Then, the pattern portion is drawn in turn by forming a single beam for each of the rectangular figures 27.

On the contrary, in the VSB lithography system according to the present invention, a pattern portion having an oblique side that is inclined at an arbitrary angle, as it is, is divided as oblique line FIG. 28 composed of four sides including an oblique line portion, as shown in FIG. 15 (b). Then, divided figures generated by such data processing are respectively drawn at once by a single beam. Therefore, the drawing time of the LSI wiring pattern can be significantly shortened.

Figure 16:
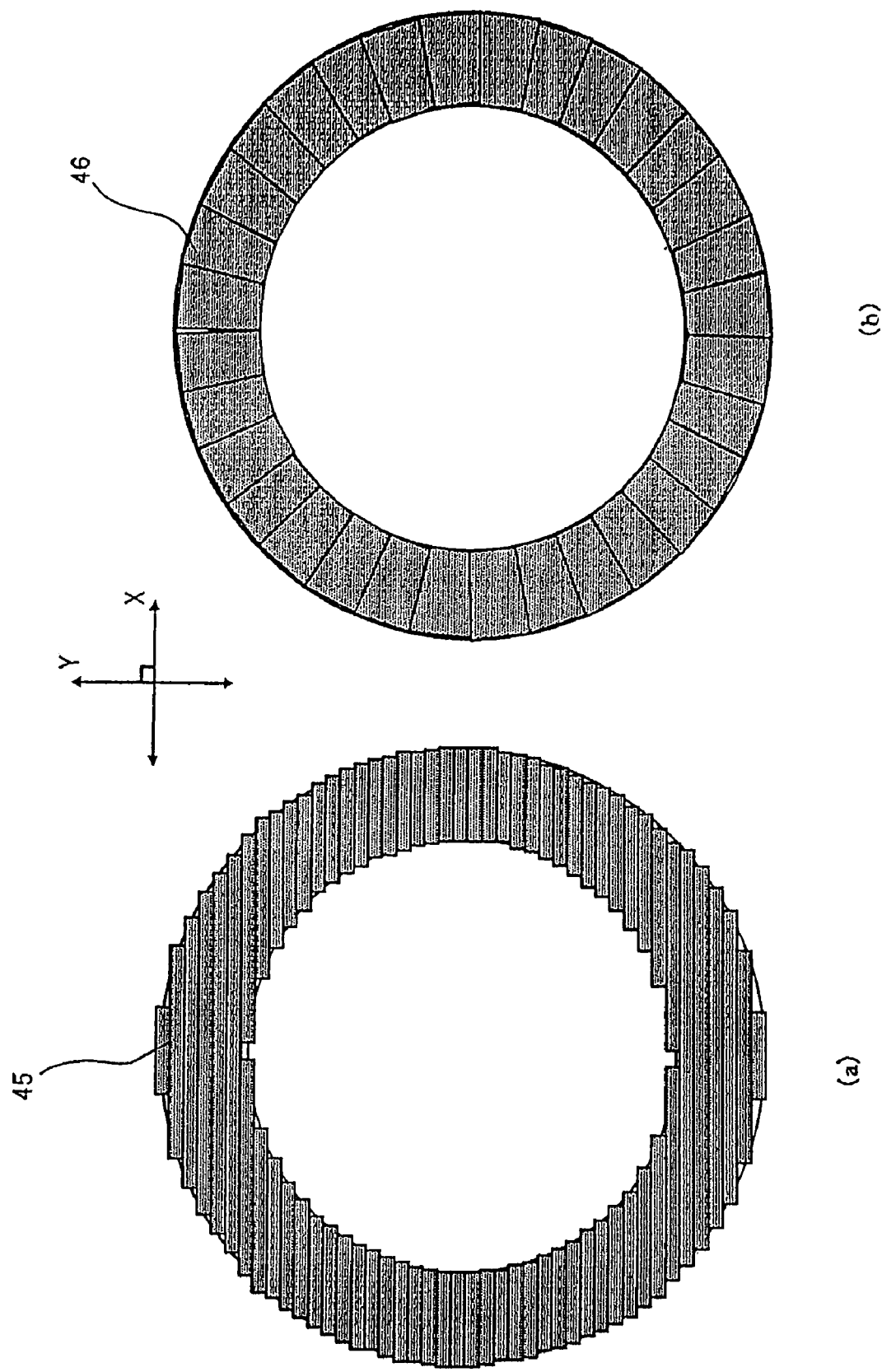
FIG. 16 is a view illustrating an exemplary embodiment for figure division of a silicon micro ring pattern in the drawing system of the present invention.

Further, FIG. 16 illustrates a silicon micro ring pattern.

When the silicon micro ring as shown or a silicon wire of a photonic network system is drawn by a beam, in a conventional VSB lithography system, the ring pattern, as shown in FIG. 16 (a), is divided into a plurality of elongated, rectangular figures 45 horizontal to the X-axis in the XY drawing rectangular coordinate system, and each of the divided rectangular figures 45 is drawn.

Figure 17:
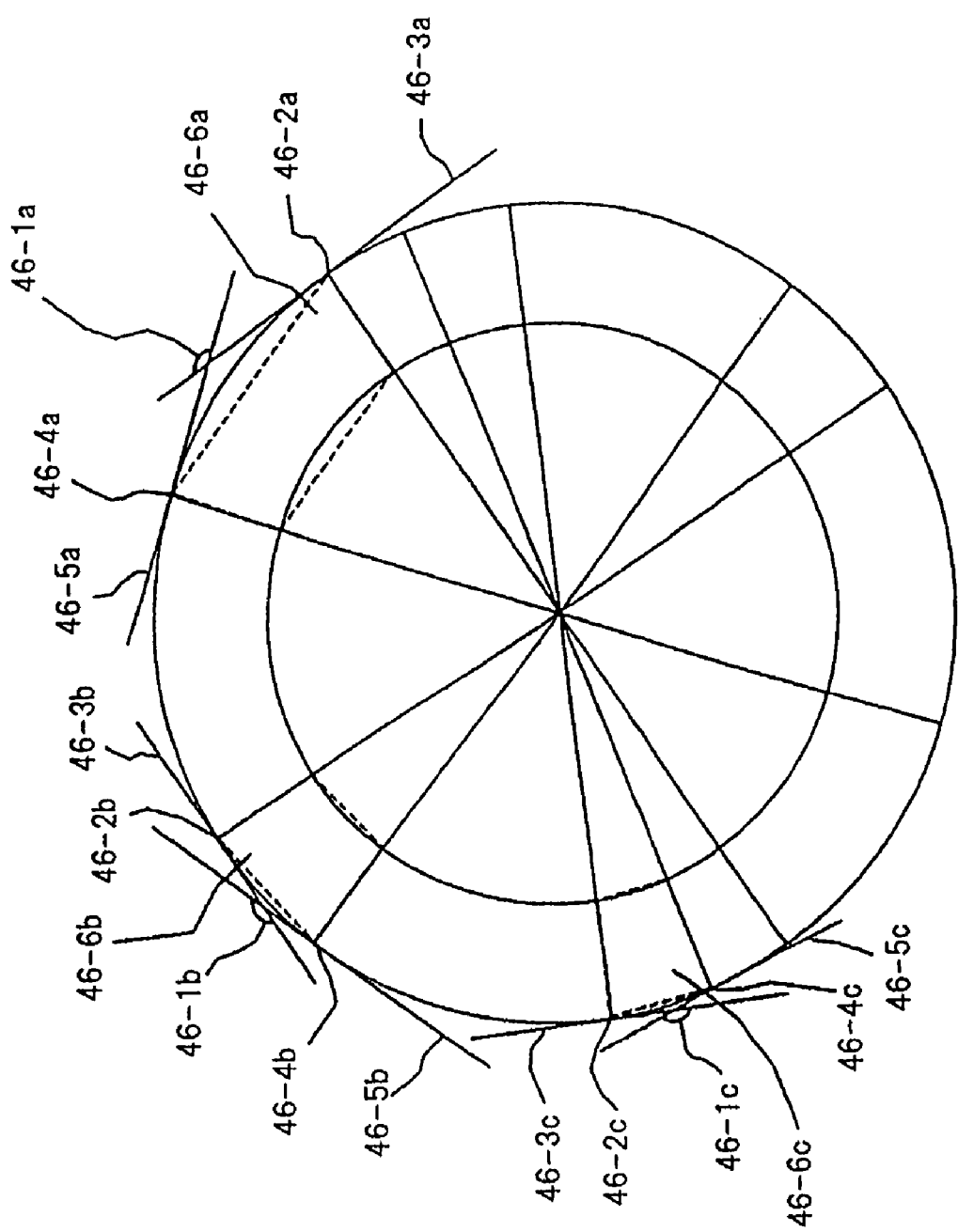
FIG. 17 is a view for describing a method for dividing a figure as shown in FIG. 16 (b).

On the contrary, in the lithography system according to the present invention, an angle 46-1c is, as shown in FIG. 17, smaller than 180°, which is made between two tangents 46-3c, 46-5c touching the outer peripheral circle of the ring pattern at points of tangency 46-2c, 46-4c. Moreover, the two points of tangency 46-2c, 46-4c are selected so as to define a threshold for meeting a desired approximate accuracy and an angle which can equally divide the circumference by the distance between the points of tangency 46-2c, 46-4c. Then, the ring pattern is approximated by an aggregate of a trapezoidal FIG. 46-6c defined by four apexes at which two straight lines connecting the two selected points of tangency 46-2c, 46-4c with the center of the outer peripheral circle intersect with the outer peripheral line and an inner peripheral line of the ring pattern. Subsequently, a single beam is formed into the same shape as trapezoidal FIG. 46-6c, and a single beam 46 subsequently formed is rotated by a varied angle, respectively, and is drawn in turn, as shown in FIG. 16 (b).

Using the lithography system of the present invention as shown in FIG. 16 (b), the total number of the divided figures of a pattern can be smaller and the approximate accuracy in the circumference portion can be better, compared to the case of the divided drawing figures shown in FIG. 16 (a).

Next, industrial applicability will be described.

In the field of LSI design, as fine wiring processing technology improves, it is believed that transistor technology will advance. Concerning a memory device, a reduction in size of a device chip leads directly to a decrease in unit cost of a chip. Therefore, LSI design effective for the reduction in size of a chip will becomes increasingly important in the future. To achieve an effective LSI design, a design method is newly studied by which a pattern is positioned in the oblique direction that is inclined at an arbitrary angle, as opposed to a conventional design method by which a pattern is positioned in the horizontal or vertical direction in the XY drawing rectangular coordinate system. In this design method, a figure having an oblique line that is inclined at an arbitrary angle relative to the XY drawing rectangular coordinate system is used. Therefore, when an LSI pattern having such figure is drawn on a photo-mask, by using the VSB lithography system according to the present invention, device makers can be provided with a high-quality and low-cost photo-mask.

Further, an LSI pattern is conventionally an aggregate of a square and a rectangle, but on the contrary, in a pattern drawing for a photo-mask used in a lithography process for MEMS or a mold for nanoimprinting, or in a pattern drawing directly on a wafer used in maskless lithography, an unusual figure having an oblique side, a circle and an arc is used. The present invention is a technology suitable for drawing such figure, therefore also in the industrial field described above, the present invention can be widely used as means for efficient manufacturing technology.

While preferred embodiments of the present invention have been described using specific terms, such description is for illustrative purposes only, and it is to be understood that changes and variations may be made without departing from the spirit or scope of the following claims.

What is claimed is:

1. A variable shaped electron beam lithography system comprising a first, second and third aperture for forming a single electron beam in each of the rectangular opening portion that are provided, and for drawing a figure pattern using a single electron beam shot formed by passing the beam through the first, second and third aperture in sequence, said system comprising:

a rotary drive mechanism provided in each of the first and second aperture, for rotationally driving each of the apertures around an optical axis up to an arbitrary angle from 0 to 360°; and a variable slit width mechanism for varying an opening slit width of the rectangular opening portion provided in the third aperture.

2. The variable shaped electron beam lithography system according to claim 1, wherein when drawing a figure pattern including two opposite, oblique sides each of which forms an arbitrary angle with a coordinate axis in an XY drawing rectangular coordinate system, on a drawn target substrate, a position at which each side of the rectangular opening portion of each aperture becomes parallel or vertical relative to the coordinate axis in the XY drawing rectangular coordinate system is defined as a rotary reference for each aperture, the first aperture is rotated by the rotary drive mechanism from the rotary reference by an angle coincident with an angle of one of the two oblique sides, and the second aperture is rotated by the rotary drive mechanism from the rotary reference by an angle coincident with an angle of the other of the two oblique sides; and a single electron beam is formed into a shape of the figure pattern using the rectangular opening portions of the first and second aperture that have been rotated, and the rectangular opening portion of the third aperture, and is projected onto the drawn target substrate.

3. The variable shaped electron beam lithography system according to claim 1, wherein when drawing, on the drawn target substrate, a figure pattern which is a quadrangle and composed of two opposite, oblique sides each of which makes an arbitrary angle relative to the coordinate axis in the XY drawing rectangular coordinate system and two opposite, parallel sides parallel or vertical to the coordinate axis in the XY drawing rectangular coordinate system, a position at which each side of the rectangular opening portion of each aperture becomes parallel or vertical to the coordinate axis in the XY drawing rectangular coordinate system is defined as a rotary reference for each aperture, the first aperture is rotated by the rotary drive mechanism from the rotary reference by an angle coincident with an angle of one of the two oblique sides, and the second aperture is rotated by the rotary drive mechanism from the rotary reference by an angle coincident with an angle of the other of the two oblique sides;

the opening slit width of the rectangular opening portion of the third aperture is changed by the variable slit width mechanism to a dimension obtained by multiplying a distance between the two parallel sides by the inverse of the reduction rate of a reduction lens system for reducing and projecting the single electron beam, formed by passing the beam through the first, second and third aperture in sequence, on the drawn target substrate; and the single electron beam is formed into a shape of the figure pattern using the rectangular opening portions of the first and second aperture that has been rotated, and the rectangular opening portion of the third aperture, subsequently is reduced to be the same size as the figure pattern by the reduction lens system, and is projected onto the drawn target substrate.

4. The variable shaped electron beam lithography system according to claim 3, further comprising:

a rotary drive mechanism for rotationally driving the third aperture around an optical axis up to an arbitrary angle from 0 to 360°.

5. The variable shaped electron beam lithography system according to claim 4, wherein in drawing a rotated figure pattern formed by rotating the figure pattern of the quadrangle around the center of the figure thereof by an arbitrary angle on the drawn target substrate, the single electron beam is formed into a shape of the rotated figure pattern, by rotating each aperture by each rotary drive mechanism from the rotary reference by a value of the sum of the rotation angle of each aperture when the figure pattern of the quadrangle is drawn, and when the angle is the same as the rotation angle of the rotated figure pattern.

6. A method for drawing a figure pattern by variable shaped electron beam lithography system, wherein a figure pattern to be drawn on a drawn target substrate is divided into a plurality of figure portions and for each of the divided figure portions, a single electron beam is formed into the shape of the divided figure portion to draw each of the figure portions, said method comprising the steps of:

varying an opening slit width of a rectangular opening portion provided in a third aperture;

forming the single electron beam into the same shape as the oblique line figure portion without dividing the oblique line figure portion; and drawing the figure pattern on the drawn target substrate, wherein the figure pattern includes the oblique line figure portion including two opposite, oblique lines each of which makes an arbitrary, different angle with a coordinate axis in an XY drawing rectangular coordinate system.

7. A method for drawing a figure pattern by variable shaped electron beam lithography system, wherein a figure pattern to be drawn on a drawn target substrate is divided into a plurality of figure portions and for each of the divided figure portions, a single electron beam is formed into the shape of the figure portion to draw each of the figure portions, said method comprising the steps of:

varying an opening slit width of a rectangular opening portion provided in a third aperture;

approximating a drawing region between an outer peripheral line and an inner peripheral line of a ring pattern by a plurality of the same trapezoidal figures equally divided;

forming the single electron beam for each of the divided trapezoidal figures into the same shape of the trapezoidal figure; and drawing the ring pattern on the drawn target substrate in turn.

8. The method for drawing a figure pattern by variable shaped electron beam lithography system according to claim 6 or 7, wherein the drawn target substrate is a dry plate.

9. The method for drawing a figure pattern by variable shaped electron beam lithography system according to claim 6 or 7, wherein the drawn target substrate is a semiconductor wafer.

10. The method for drawing a figure pattern by variable shaped electron beam lithography system according to claim 6, further comprising:

rotationally driving a first and a second apertures around an optical axis up to an arbitrary angle from 0 to 360°.

11. The method for drawing a figure pattern by variable shaped electron beam lithography system according to claim 7, further comprising:

rotationally driving a first and a second apertures around an optical axis up to an arbitrary angle from 0 to 360°.

* * * * *